(12) United States Patent
Stone-Sundberg et al.

(10) Patent No.: US 7,326,477 B2
(45) Date of Patent: *Feb. 5, 2008

(54) SPINEL BOULES, WAFERS, AND METHODS FOR FABRICATING SAME

(75) Inventors: Jennifer Stone-Sundberg, Portland, OR (US); Milan Kokta, Washougal, WA (US); Robert Cink, Camas, WA (US); Hung Ong, Vancouver, WA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 439 days.

This patent is subject to a terminal disclaimer.

(21) Appl. No.: 10/668,610

(22) Filed: Sep. 23, 2003

(65) Prior Publication Data

US 2005/0061231 A1 Mar. 24, 2005

(51) Int. Cl.
*C30B 29/16* (2006.01)
*C30B 29/22* (2006.01)

(52) U.S. Cl. .................... 428/702; 428/64.1; 428/701; 423/594.6; 423/600; 117/944; 117/950

(58) Field of Classification Search .................... None
See application file for complete search history.

(56) References Cited

U.S. PATENT DOCUMENTS

| | | | |
|---|---|---|---|
| 2,634,554 A * | 4/1953 | Barnes et al. ................. | 117/12 |
| 3,424,955 A | 1/1969 | Seiter et al. | |
| 3,625,868 A | 12/1971 | Grabmaier et al. | |
| 3,655,439 A | 4/1972 | Seiter | |
| 3,658,586 A | 4/1972 | Wang | |
| 3,736,158 A | 5/1973 | Cullen et al. | |
| 3,753,775 A | 8/1973 | Robinson et al. | |
| 3,796,597 A | 3/1974 | Porter et al. | |
| 3,808,065 A | 4/1974 | Robinson et al. | |
| 3,808,836 A * | 5/1974 | Jones ........................... | 63/32 |
| 3,816,906 A | 6/1974 | Falckenberg | |
| 3,883,313 A | 5/1975 | Cullen et al. | |
| 3,885,978 A | 5/1975 | Doi et al. | |

(Continued)

FOREIGN PATENT DOCUMENTS

CN 1291795 4/2001

(Continued)

OTHER PUBLICATIONS

Yumashev K.V., et al., "$Co^{2+}$-doped spinels saturable absorber Q-switches for 1.3-1.6 µm solid state lasers", OSA Trends in Optcs and Photonics. Advanced Solid State Lasers., vol. 34, pp. 236-239, 2000. XP008017966.

(Continued)

*Primary Examiner*—Jennifer C. McNeil
*Assistant Examiner*—Timothy M. Speer
(74) *Attorney, Agent, or Firm*—Larson Newman Abel Polansky & White, LLP

(57) ABSTRACT

A single crystal spinel wafer is disclosed, including a front face and a back face; and an outer periphery having first and second flats. In certain embodiments, the single crystal wafer has a specific crystallographic orientation, and the flats are provided to extend along desired plane sets. The flats may advantageously identify orientation of cleavage planes, and direction of cleavage of cleavage planes.

26 Claims, 4 Drawing Sheets

U.S. PATENT DOCUMENTS

| | | | |
|---|---|---|---|
| 3,898,051 A | 8/1975 | Schmid |
| 3,950,504 A | 4/1976 | Belding et al. |
| 3,964,942 A | 6/1976 | Berkenblit et al. |
| 3,990,902 A | 11/1976 | Nishizawa et al. |
| 4,000,977 A | 1/1977 | Falckenberg |
| 4,177,321 A | 12/1979 | Nishizawa |
| 4,347,210 A | 8/1982 | Maguire et al. |
| 4,370,739 A | 1/1983 | Wang et al. |
| 4,493,720 A | 1/1985 | Gauthier et al. |
| 4,627,064 A | 12/1986 | Auzel et al. |
| 4,649,070 A | 3/1987 | Kondo et al. |
| 4,657,754 A | 4/1987 | Bauer et al. |
| 4,755,314 A | 7/1988 | Sakaguchi et al. |
| 4,819,167 A | 4/1989 | Cheng et al. |
| 4,963,520 A | 10/1990 | Yoo et al. |
| 5,138,298 A | 8/1992 | Shino |
| 5,530,267 A | 6/1996 | Brandle, Jr. et al. |
| 5,557,624 A | 9/1996 | Stultz et al. |
| 5,643,044 A | 7/1997 | Lund |
| 5,644,400 A | 7/1997 | Mundt |
| 5,654,973 A | 8/1997 | Stultz et al. |
| 5,741,724 A | 4/1998 | Ramdani et al. |
| 5,742,026 A | 4/1998 | Dickinson, Jr. et al. |
| 5,768,335 A | 6/1998 | Shahid |
| 5,802,083 A | 9/1998 | Birnbaum |
| 5,822,213 A | 10/1998 | Huynh |
| 5,825,913 A | 10/1998 | Rostami et al. |
| 5,850,410 A | 12/1998 | Kuramata |
| 5,968,267 A | 10/1999 | Li |
| 5,982,796 A | 11/1999 | Kokta et al. |
| 5,989,301 A | 11/1999 | Laconto, Sr. et al. |
| 6,021,380 A | 2/2000 | Fredriksen et al. |
| 6,023,479 A | 2/2000 | Thony et al. |
| 6,048,577 A | 4/2000 | Garg |
| 6,104,529 A | 8/2000 | Brandle, Jr. et al. |
| 6,238,450 B1 | 5/2001 | Garg et al. |
| 6,258,137 B1 | 7/2001 | Garg et al. |
| 6,265,089 B1 | 7/2001 | Fatemi et al. |
| 6,364,920 B1 | 4/2002 | Garg et al. |
| 6,366,596 B1 | 4/2002 | Yin et al. |
| 6,391,072 B1 | 5/2002 | Garg |
| 6,406,769 B1 | 6/2002 | Delabre |
| 6,418,921 B1 | 7/2002 | Schmid et al. |
| 6,533,874 B1 | 3/2003 | Vaudo et al. |
| RE38,489 E | 4/2004 | Thony et al. |
| 6,839,362 B2 | 1/2005 | Kokta et al. |
| 6,844,084 B2 * | 1/2005 | Kokta et al. ............ 428/640 |
| 6,846,434 B2 | 1/2005 | Akselrod |
| 7,045,223 B2 * | 5/2006 | Kokta et al. ............ 428/702 |
| 2001/0026950 A1 | 10/2001 | Sunakawa et al. |
| 2002/0028314 A1 | 3/2002 | Tischler et al. |
| 2002/0030194 A1 | 3/2002 | Camras et al. |
| 2003/0007520 A1 | 1/2003 | Kokta et al. |
| 2003/0188678 A1 | 10/2003 | Kokta et al. |
| 2003/0190770 A1 | 10/2003 | Yeom et al. |
| 2003/0213950 A1 | 11/2003 | Hwang |
| 2004/0063236 A1 | 4/2004 | Kwak et al. |
| 2004/0089220 A1 | 5/2004 | Kokta et al. |

FOREIGN PATENT DOCUMENTS

| | | |
|---|---|---|
| CN | 1379484 | 11/2002 |
| CN | 1469459 | 1/2004 |
| CN | 1476046 | 2/2004 |
| CN | 1476047 | 2/2004 |
| EP | 0 148 656 A1 | 11/1984 |
| EP | 0 263 171 B1 | 11/1992 |
| EP | 997445 | 5/2000 |
| EP | 0 762 930 B1 | 7/2000 |
| EP | 1298709 | 4/2003 |
| EP | 1394867 | 3/2004 |
| FR | 1471976 | 3/1966 |
| JP | 53-043481 | 4/1978 |
| JP | 79-026873 | 9/1979 |
| JP | 58-090736 | 5/1983 |
| JP | 58-211736 | 12/1983 |
| JP | 61-142759 | 6/1986 |
| JP | 62-123059 | 6/1987 |
| JP | 62-188325 | 8/1987 |
| JP | 7-235692 | 9/1995 |
| JP | 07-307316 | 11/1995 |
| JP | 8-040797 | 2/1996 |
| JP | 8-083802 | 3/1996 |
| JP | 8-095233 | 4/1996 |
| JP | 9-129651 | 5/1997 |
| JP | 9-129928 | 5/1997 |
| JP | 09-278595 | 10/1997 |
| JP | 11-157997 | 6/1999 |
| JP | 11-195813 | 7/1999 |
| JP | 11-235659 | 8/1999 |
| JP | 11-274559 | 10/1999 |
| JP | 2000-228367 | 8/2000 |
| JP | 2000-331940 | 11/2000 |
| JP | 2001-010898 | 1/2001 |
| JP | 2001-080989 A | 3/2001 |
| JP | 2001-198808 | 7/2001 |
| JP | 2001-220295 | 8/2001 |
| JP | 2001-253800 | 9/2001 |
| JP | 2002-012856 | 1/2002 |
| JP | 2002-050577 | 2/2002 |
| JP | 2002-158377 | 5/2002 |
| JP | 2002-255694 | 9/2002 |
| JP | 2002-353425 | 12/2002 |
| JP | 2003-045829 | 2/2003 |
| JP | 2003-113000 | 4/2003 |
| JP | 2003-124151 | 4/2003 |
| JP | 2003-165042 | 6/2003 |
| JP | 2003-273022 | 9/2003 |
| JP | 2003-320521 | 11/2003 |
| JP | 2003-334754 | 11/2003 |
| JP | 2003-338638 | 11/2003 |
| JP | 2004-006867 | 1/2004 |
| JP | 2004-014691 | 1/2004 |
| JP | 2004-140394 | 5/2004 |
| KR | 2002-043128 | 6/2002 |
| SU | 1781271 | 12/1992 |
| TW | 550836 | 9/2003 |
| WO | WO 00/68332 | 11/2000 |
| WO | WO 01/99155 A2 | 12/2001 |
| WO | WO 02/092674 | 11/2002 |
| WO | WO 02/95887 A2 | 11/2002 |
| WO | WO 2004/033769 | 4/2004 |

OTHER PUBLICATIONS

Yumashev, K.V., et al., "Passive Q-switching of 1.34-m neodymium laser using $Co^{2+}$:$LiGa_5O_8$ and $Co^{2+}$:$MgAl_2O_4$,", Conference Digest, 2000, 1 page. XP002242959.

Oktyabrsky, S., et al., "Crystal structure and defects in nitrogen-deficient GaN", MRS Internet J. Nitride Semicond. Res, G6.43, pp. 1-6, 1999.

Kleber, W., et al., "Zur epitaxie von galliumnitrid auf nichtstochiometrischem spinell im system $GaCl/NH_3/He$", Crystal Research and Technology, vol. 10, No. 7, pp. 747-758, 1975. (English Abstract).

Seifert, A., "Nachweis von stapelfehlern in GaN-epitaxieschichten mittels elektronenbeugung", Crystal Research and Technology, vol. 10, No. 7, pp. 741-746, 1975. (English Abstract).

Ohsato, H., et al., "Epitaxial orientation and a growth model of (0 0 • 1) GaN thin film on (1 1 1) spinel substrate", Journal of Crystal Growth, vol. 189/190, pp. 202-207, 1998.

Yang, H. -F., et al., "Microstructure evolution of GaN buffer layer on $MgAl_2O_4$ substrate", Journal of Crystal Growth, vol. 193, pp. 478-483, 1998.

Duan, S., et al., "MOVPE growth of GaN and LEDon (1 1 1) MgAl₂O₄", Journal of Crystal Growth, vol. 189/190, pp. 197-201, 1998.

Sheldon, R., et al., "Cation Disorder and Vacancy Distribution in Nonstoichiometric Magnesium Aluminate Spinel, MgO • Al₂O₃", J. Am. Ceram. Soc., vol. 82, No. 12, pp. 3293-3298, 1999.

Kuleshov, N.V., et al. "Co-doped spinels: promising materials for solid state lasers", Longer Wavelength Lasers and Applications, vol. 2138, pp. 175-182, 1994. XP008017848.

Kuleshov, N.V., et al., "Absorption and luminescence of tetrahedral $Co^{2+}$ ion in $MgAl_2O_4$, vol. 55, No. 5-6, pp. 265-269, 1993. XP008017849.

Nikishin, S.A., et al., "Gas source molecular beam epitaxy of GaN with hydrazine on spinel substrates", Applied Physics Letters, vol. 72, No. 19, pp. 2361-2363, 1998. XP000755963.

Haisma, et al., "Lattice constant adaptable crystallographics", Journal of Crystal Growth, vol. 102, pp. 979-993, 1990. XP002250056.

Tamura, K., et al., "Epitaxial growth of ZnO film on lattice-matched ScAlMgO₄ (0001) substrates", Journal of Crystal Growth, vol. 214-215, pp. 59-62, 2000. XP004200964.

Wyon, et al., "Czochralshi growth and optical properties of magnesium-aluminum spinel doped with nickel", Journal of Crystal Growth, vol. 79, pp. 710-713, 1986. XP002250057.

Tsuchiya, T., et al. "Epitaxial growth of InN films on $MgAl_2O_4$ (1 1 1) substrates", Journal of Crystal Growth, vol. 220, pp. 185-190, 2000.

Kuramata, Akito, et al., "High-quality GaN epitaxial layer grown by metalorganic vapor phase epitazy on (111) $MgAl_2O_4$ substrate", Appl. Phys. Lett., vol. 67, No. 17, pp. 2521-2523, 1995.

Mitchell, T., "Dislocations and Mechanical Properties of MgO-$MgAl_2O_3$ spinel single crystals", J. Am. Ceram. Soc., vol. 82, No. 12, pp. 3305-3316, 1999.

Hellman, E., "Exotic and Mundane substrates for gallium nitride heteroepitaxy", Bell Laboratories, THC2, Murray Hill, NJ.

Kruger, M.B., et al., "Equation of state of $MgAl_2O_4$ spinel to 65 GPa", The American Physical Society, vol. 56, No. 1, pp. 1-4, 1997.

Kuramata, A., et al., "Properties of GaN epitaxial layer grown on (111) $MgAl_2O_4$ substrate", Solid-State Electronics, vol. 41, No. 2, pp. 251-254, 1997.

Gritsyna, V., et al., "Structure and Electronic states of defects in spinel of different compositions MgO • n $MgAl_2O_3$ :Me", J. Am. Ceram. Soc. vol. 82. No. 1, pp. 3365-3373, 1999.

U.S. Appl. No. 10/669,141, filed Sep. 23, 2003, Kokta et al.
U.S. Appl. No. 10/669,135, filed Sep. 23, 2003, Kokta et al.
U.S. Appl. No. 10/669,145, filed Sep. 23, 2003, Kokta et al.

Efimov, A.N., et al., "Onan Unusual Azimuthal Orientation Relationship in the System Gallium Nitride Layer on Spinel Substrate", Crystallography Reports, 45(2): 312-317 (2000).

Sun C.J., et al., "Mg-doped green light emitting diodes over cubic (1 1 1) MgAl204 substrate", App. Phys. Lett. 72(19): 2361-2363 (1998).

Efimov, A.N., et al., "Symmetry constraints and epitaxial growth on non-isomorphic substrate", Thin Solid Films 260: 111-117 (1995).

George, T., et al., "Novel symmetry in the growht of gallim nitride on magnesium aluminate substrates", Appl. Phys. Lett. 68(3): 337-339 (1996).

Sun C.J., et al., "Deposition of high quality wurtzite GaN films over cubic (1 1 1) MgAl204 substrates using low pressure and metalorganic chemical vapor deposition," Appl. Phys. Lett. 68(8): 1129-1131 (1996).

Nakamura, S., et al., "Characteristics of InGaN multi-quantum-well-structure laser diodes," Appl. Phys. Lett. 68(23): 3269-3271 (1996).

Khan, M.A., et al., "Cleaved cavity optically pumped InGaN-GaN laser grown on spinel substrates," Appl. Phys. Lett. 69(16): 2418-2420 (1996).

Tempel, A., et al., "Nachweis von Stapelfehlern in GaN-Exitaxieschichten mittels Elecktronenbeugung," Kristall und Technik 10(7): 741-746 (1975).

Tempel, A., et al., "Zur Epitaxie von Galliumnitride auf nichtstoechiometrischem Spinell im System GaCl/NH3/He," Kristall und Technick 10(7): 747-758 (1975).

K.V. Yumashev, "Saturable absorber Co2+: MgAl203 crystal for Q switching of 1.34-um Nd3+: YAl03 and 1.54-um Er3+: glass lasers," Applied Optics 38(30): 6343-6346 (1999).

Camargo, M.B., et al., "Co2+ Y3Sc2Ga3012 (YSGG) Passive Q-Switch for Infared Erbium Lasers," submitted to LEOS in 1994.

Mikhailov, V.P., et al., "Passive Q-switch performance at 1.3u (1.5u) and nonlinear spectroscopy of Co2+: MgAl204 and Co2+: LaMgAl1109 cyrstals," OSA TOPS vol. 26 Advanced Solid-State Lasers, pp. 317-324 (1999).

Stulz, R.D., et al., "Diavalent Uranium and Cobalt Saturable Absorber Q-Switches at 1.5um,"OSA Proceedings on Advanced Solid-State Lasers, 24:460-464 (1995).

Birnbaum, M., et al., "Co2+: ZnSe Saturable Absorber Q-Switch for the 1.54 Um Er3+: Yb3+: Glass Laser," OSA TOPS vol. 10 Advanced Solid State Lasers, pp. 148-151 (1997).

Machida, H., et al., "difficulties encoutered during the Czochralxki growth of TiO2 single crystals," Journal of Cyrstal Growth, 112: 835-837 (1997).

Camargo, M.B., et al., "Broad-band 1.54 um Saturable Absorber Q-switch with Co2+," submitted to ASSL in 1995.

Yumashev, K.V., et al., "Nonlinear spectroscopy and passive Q-switching operation of a Co2+: LaMgAl11O19 crystal," J. Opt. Soc. Am. B., 16(12): 2189-2194 (1999).

Giess et al., "Growth of Single Crystal MgGa2O4 Spinel", IBM Technical Disclosure Bulletin, vol. 15, No. 1, Jun. 1972, pp. 151-152, XP-002315746.

Anon., "Spinel Crystals for Electronic Devices", Manufacturing Technology Note, vol. NTN-77, No. 0735, Apr. 1977, XP-002315747.

Grabmaier et al., "Czochralski Growth of Magnesium-Aluminum Spinel", J. American Ceramic Society, vol. 51, No. 6, Jun. 1968, pp. 355-356, XP-002315185.

Wyon et al., "Czochralski Growth and Optical Properties of Magnesium-Aluminum Spinel Doped with Nickel", Journal of Crystal Growht, North-Holland Publishing Co. Amsterdam, NL, vol. 79, No. 1-3, part 2, 1986, pp. 710-713, XP-002250057.

Pinckney, L.R., "Transparent, high strai point spinel glass-ceramics", Journal of Non-Crystalline Solids, vol. 255, pp. 171-177, 1999.

Nakamura, S. "Current Status and Furture Prospects of InGaN-Based Laser Diodes", ISAP International, vol. 1, pp. 5-17, 2000.

Kisailus D., et al., "Growth of Epitaxial GaN of LiGaO2 Substrates Via a Reaction With Ammonia", J. Mater. Res., vol. 16, No. 7, pp. 2077-2081, 2001.

Nakamura, S., et al., "InGaN MQW LDs Grown on MgAl204 Substrates," In The Blue Laser Diode, (NY: Springer-Verlag), pp. 233-243, 1997 (update included).

Mordoc, H., et al., "Large-band-gap SiC, III-V nitride, and II-vi ZnSe-based Semiconductor Device Technologies", J. Appl. Phys., vol. 76, No. 3, pp. 1363-1398, 1994.

Aeschlimann, R. et al., "The Chemical Polishing of Magnesium Aluminate Spinel in Pyrophosphoric Acid", Mat. Res. Bull., vol. 5, pp. 167-172, 1970.

Dwikusuma, F., "Study on Sapphire Surface Preparation for III-Nitride Heteroepitaxial Growth by Chemical Treatments", Journal for Electrochemical Soc., Nov. 2002, 30 pgs.

Kim, S. et al., "Stress Relaxation in Thick-Film GaN Grown by Hydride Vapor Phase Epitaxy on Sapphire and Spinel Substrates as Studied by Photoluminescence and Raman Spectroscopy", J. of the Kr Phys Soc., vol. 34, No. 2, Feb. 1999, pp. 163-167.

Kurobe, Toshiji, et al., "Magnetic Field-Assisted Lapping", Bull. Japan Soc. of Prec. Engg., vol. 20, No. 1, Mar. 1986, pp. 49-51.

Libowitzky, E., "Optical Anisotropy in the Spinel Group: a Polishing Effect", Eur. J. Mineral., vol. 6, 1994, pp. 187-194.

Reisman, A., et al., "The Chemical Polishing of Sapphire and MgAl Spinel", J. Electrochem. Soc.: Solid State Science, vol. 118, No. 10, Oct. 1971, pp. 1653-1657.

Richter, F., et al., "Herstellung und Aurichtung Von MgAl-Spinell-Substraten fur die Halbleiterepitaxie", Kristall und Technik, vol. 10, No. 3, 1975, pp. 33-348.

Robinson, P., et al., "The Chemical Polishing of Sapphire and Spinel", RCA Review, vol. 34, Dec. 1973, pp. 616-629.

Roy, D., et al., "Spinel, Where did it go?", SPIE vol. 3134, pp. 307-316.

Wang, C., et al., "Growth and Characterization of Spinel Single Crystal for Substrate Use in Integrated Electronics", J. Applied Physics, vol. 40, No. 9, Aug. 1969, pp. 3433-3444.

Yanina, S., et al., "Moving Steps and Crystal Defects on Spinel Surfaces", Mat. Res. Soc. Symp., vol. 620, 2000, pp. M9.4.1-M9.4.6.

Byun, D., et al., "Reactive ion (N2+) Beam Pretreatment of Sapphire for GaN Growth", Thin Solid Films, vol. 326, 1998, pp. 151-153.

Byun, D., et al., "New Pretreatment Method of Sapphire for GaN Deposition", Phys. Stat. Sol., vol. 176, 1999, pp. 643-648.

Sung, Y., et al., "High Rate Etching of Sapphire Wafer Using C12BC13Ar Inductively Coupled Plasmas", Mat. Sci. & Eng.: Sold State Mat, vol. B82, No. 1-3 2000, pp. 50-52. (Abstract Only).

Wang, X., et al., "Chemical Polishing of Sapphire for Growth of GaN", Chinese Journal of Semiconductors, vol. 18, No. 11, pp. 867-871, 1997. (Abstract Only).

Lee, J., et al., "Scribing and Cutting a Blue LED Wafer Using a Q-Switched Nd:YAG Laser", Applied Physics, vol. 70, No. 5, pp. 561-564, 2000. (Abstract Only).

Kalinski, Z., "Preparation of Sapphire Substrates for Gas Phase GaN Epitaxial Processes", Kristal und Technik, vol. 12, No. 10, pp. 1105-1110, 1977. (Abstract Only).

Jeong, C., et al., "Sapphire Etching with BC13/HBr/Ar Plasma", Surface & Coatings Technology, vol. 171, No. 1-3, 2003, pp. 280-284. (Abstract Only).

Kalinski, Z., et al., "Structural Etching of Al2O3 Substrate Plates Applied in Gaseous Epitaxy of GaN Layers", Elektronika, vol. 18, No. 3, 1977, pp. 117-119. (Abstract Only).

Lakew, B., et al., "High Tc Superconducting Bolometer on Chemically Etched 7 Micrometer Thick Sapphire", NASA, 1997, 21 pgs. (Abstract Only).

Jeong, C., et al., "Dry Etching of Sapphuire Substrate for Device Separation in Chlorine-Based Inductively Coupled Plasmas", Mat. Sci. & Eng.: Solid State Materials, vol. 93, No. 1-3, pp. 60-63, 2002. (Abstract Only).

Gu, E., et al., "Micromachining and Dicing of Sapphire, Gallium Nitride and Micro LED Devices with UV Copper Vapour Laser", Thin Solid Films, vol. 453-454, pp. 462-466, 2000. (Abstract Only).

Park, H., et al., "A Novel Process for the Generation of Pristine Saphire Surfaces", Thin Solid Films, vol. 422, No. 1-2, pp. 135-140, 2000. (Abstract Only).

Fenner, D., et al., "Ion Beam Nanosmoothing of Sapphire and Silicon Carbide Surfaces", SPIE, vol. 4468, pp. 17-24, 2001. (Abstract Only).

Blecha, Z., et al., "On Fabrication of Sapphire Substrates (1102) for Epitaxy of Monocrystalline Silicon", Jemna Mechanika a Optika, vol. 28, No. 12, pp. 249-351, 1983. (Abstract Only).

Duffy, M., et al., "Optical Characterization of Silicon and Sapphire Surfaces as related to SOS Discrete Device Performance", Journal of Crystal Growth, vol. 58, No. 1, pp. 19-36, 1982. (Abstract Only).

Ehman, M., et al., "Mechanical Preparation of Sapphire Single-Crystal Surfaces by Vibratory Techniques", METALLOGRAPHY, vol. 9, No. 4, pp. 333-339, 1976. (Abstract Only).

Druminiski, M., et al., "Deposition of Epitaxial Films on Spinel and Sapphire. Influence of Substrate Preparation", Siemens Forschungs—und Entwicklungsberichte, vol. 5, No. 3, pp. 139-145, 1976. (Abstract Only).

Cullen, G., "The Preparation and Properties of Chemically Vapor Deposited Silicon on Sapphire and Spinel", Journal of Crystal Growth, vol. 9, pp. 107-125, 1971. (Abstract Only).

Liu, L., et al., "Substrates for Gallium Nitride Epitaxy", Mat. Sci. & Eng. Reports, vol. R37, No. 3, pp. 61-127, 2000. (Abstract Only).

Khattak, C., et al., "Production of Sapphire Blanks and Substrates for Blue LEDs and LDs", Mat. Res. Soc. Symp.—Proceedings, V. 743, pp. 219-224, 2002. (Abstract Only).

Gutsche, H., et al., "Polishing of Sapphire with Colloidal Silica", Journal of the Electrochemical Society, vol. 125, No. 1, 1978, pp. 136-138, 1978. (Abstract Only).

Duffy, M., et al., "Semiconductor Measurement Technology: Method to Determine the Quality of Sapphire, (NOTE) Final Report", RCA Labs, 1980, 77 pgs. (Abstract Only).

Duffy, M., et al, "Method to Determine Qulity of Sapphire, (NOTE) Interim Rept.", RCA Labs, 1975, 88 pgs. (Abstract Only).

Horie, S., et al., "Precision Grinding of Semiconductor—Related Materials", (JOURNAL) New Diamond, vol. 20, No. 2, pp. 8-13, 2004. (Abstract Only).

Edgar, J., et al., "Substrates for Gallium Nitride Epitaxy", Mat. Sci. & Eng., Part R, vol. R37, No. 3, pp. 61-127, 2002. (Abstract Only).

Author Unknown, "Specifications for Polished Monocrystalline Sapphire Substrates" 1996, Affiliation (Issuing Organization) SEMI Semiconductor Equipment & Materials International, USA. (Bibliographic Entry Only).

Search Report for Technical Articles (Including various Abstracts of certain Identified References).

\* cited by examiner

SPINEL BOULES, WAFERS, AND METHODS FOR FABRICATING SAME

CROSS-REFERENCE TO RELATED APPLICATION(S)

BACKGROUND

1. Field of the Invention

The present invention is generally directed to articles having a spinel crystal structure, and includes articles such as boules, wafers, substrates, and active devices incorporating same. In addition, the present invention relates generally to methods for forming such articles.

2. Description of the Related Art

Active optoelectronic devices, such as light-emitting diodes (LEDs) and lasers, oftentimes will utilize nitride-based semiconductor layers for the active layer of the device. In this regard, the family of gallium nitride (GaN) materials, which broadly includes Ga(Al, In)N materials, have been utilized as a direct transition-type semiconductor material having a band gap that may be manipulated over a fairly wide range, on the order of about 2 to 6 eV.

In order to take advantage of the optoelectronic characteristics of such nitride-based semiconductor materials, they generally are formed as a single crystal. In this regard, it is generally not pragmatic to form bulk monocrystalline boules of nitride-based semiconductor material. Accordingly, the industry typically has sought to deposit such materials as a monocrystalline layer, such as by epitaxial growth, on an appropriate substrate. It is desired that the substrate on which the nitride-based semiconductor layer is deposited has a compatible crystal structure, to manifest the desired crystal structure in the as-deposited active layer. While such nitride-based materials, such as GaN and AlN can exist in several different crystal states, typically the desired crystal structure is wurtzite rather than zinc blende. In an effort to closely match the desired wurtzite crystal structure, the art has utilized monocrystalline alumina in the form of sapphire (corundum), and specifically oriented the sapphire substrate so as to provide an appropriate crystallographic surface on which the active layer is deposited. However, sapphire suffers from numerous drawbacks. For example, sapphire does not exhibit a cleavage plane that can be used to fabricate active devices. In this regard, it is generally desirable to dice the wafer into individual die (forming active devices, each having a device substrate) by cleavage rather than by slicing or sawing, as cleavage may reduce manufacturing costs and may simplify the manufacturing process.

In contrast, spinel materials, if oriented properly, demonstrate a cleavage plane, the projection of which in the surface of the wafer is generally parallel to a cleavage plane of the nitride active layer, which permits predictable and reliable device fabrication. Proper crystallographic orientation of boules and wafers, as well as physical orientation of wafers during wafer processing (to form active devices), have been a challenge in the art. Imprecise orientation generally leads to decreased throughput and low yields.

In view of the foregoing, it is generally desirable to provide improved spinel boules, wafers, substrates, and optoelectronic devices incorporating same, as well as improved methods for forming same.

SUMMARY

According to one embodiment, single crystal spinel wafer is provided, including a front face and a back face, and an outer periphery having first and second flats. In certain embodiments, the single crystal wafer has a specific crystallographic orientation, and the flats are provided to extend along specific plane sets.

According to another embodiment, a method of forming active devices includes providing a single crystal spinel wafer having a front face, a back face, and an outer periphery having first and second flats, orienting the wafer based on the orientation of the first and second flats, forming at least one active layer to overlie the wafer, and cleaving the wafer to form active devices.

According to another embodiment, a method of forming wafers includes forming a single crystal boule having a <111> orientation, forming first and second flats in the boule, and slicing the boule into wafers, wherein the first and second flats indicate an orientation of a cleavage plane of the wafers, and identify the front and back faces of the wafers

BRIEF DESCRIPTION OF THE DRAWINGS

Features, aspects and advantages of embodiments of the present invention will become apparent from the following description, appended claims and the drawings, which are briefly described below. It should be noted that unless otherwise specified like elements have the same reference numbers.

DESCRIPTION OF THE PREFERRED EMBODIMENT(S)

Figure 1A:
FIG. 1a illustrates an as-grown spinel <111> boule, FIG. 1b a boule with the neck and tail removed, and a wafer sliced therefrom, and FIG. 1c a schematic cross-section of the wafer.

According to one aspect of the present invention, a single crystal spinel boule and single crystal spinel wafers formed therefrom are provided. Typically, processing of a single crystal spinel boule begins with the formation of a batch melt in a crucible, generally illustrated as step 210 in FIG. 11. The batch melt is generally provided to manifest a non-stoichiometric composition in the as-formed boule. According to one embodiment, the boule has a general formula of $aAD.bE_2D_3$, wherein A is selected from the group consisting of Mg, Ca, Zn, Mn, Ba, Sr, Cd, Fe, and combinations thereof, E is selected from the group consisting Al, In, Cr, Sc, Lu, Fe, and combinations thereof, and D is selected from the group consisting O, S, Se, and combinations thereof, wherein a ratio b:a>1:1 such that the spinel is rich in $E_2D_3$. For clarification, a stoichiometric composition is one in which the ratio of b:a=1:1, while non-stoichiometric compositions have a b:a ratio≠1:1.

As used herein, the term 'boule' refers to a single crystal mass formed by melt processing, and includes ingots, cylinders, or the like structures.

According to certain embodiments, A is Mg, D is O and E is Al, such that the single crystal spinel has the formula aMgO.bAl$_2$O$_3$. While some of the disclosure contained herein makes reference to the MgO—Al$_2$O$_3$ spinel based-compositions, it is understood that the present disclosure more generally relates to a broader group of spinel compositions, having the generalized formula aAD.bE$_2$D$_3$, as described above.

While E$_2$D$_3$-rich spinels are generally represented by a ratio b:a greater than 1:1, certain embodiments have a b:a ratio not less than about 1.2:1, such as not less than about 1.5:1. Other embodiments have even higher proportions of E$_2$D$_3$ relative to AD, such as not less than about 2.0:1, or even not less than about 2.5:1. According to certain embodiments, the relative content of E$_2$D$_3$ is limited, so as to have a b:a ratio not greater than about 4:1. Specific embodiments may have a b:a ratio of about 3:1 (e.g., 2.9:1).

Following formation of a batch melt in a crucible, typically, the spinel single crystal boule is formed by one of various techniques such as the Czochralski pulling technique. While the Czochralski pulling technique has been utilized for formation of certain embodiments herein, it is understood that any one of a number of melt-based techniques, as distinct from flame-fusion techniques, may be utilized. Such melt-based techniques also include the Bridgman method, the liquefied encapsulated Bridgman method, the horizontal gradient freeze method, an edge-defined growth method, the Stockberger method, or the Kryopolus method. These melt-based techniques fundamentally differ from flame fusion techniques in that melt-based techniques grow a boule from a melt. In contrast, flame fusion does not create a batch melt from which a boule is grown, but rather, provides a constant flow of solid raw material (such as in powder form) in a fluid, to a hot flame, and the molten product is then projected against a receiving surface on which the molten product solidifies.

Generally, the single seed crystal is contacted with the melt, while rotating the batch melt and the seed crystal relative to each other. Typically, the seed crystal is formed of stoichiometric spinel and has sufficiently high purity and crystallographic homogeneity to provide a suitable template for boule growth. The seed crystal may be rotated relative to a fixed crucible, the crucible may be rotated relative to a fixed seed crystal, or both the crucible and the seed crystal may be rotated. During rotation, the seed crystal and the actively forming boule are drawn out of the melt.

According to one embodiment of a present invention, average boule diameter and interior crucible diameter of the crucible containing the batch melt are controlled to be within certain parameters. Most typically, the single crystal boule is grown at a process aspect ratio of not less than about 0.39. Here, process aspect ratio is defined as a ratio of average boule diameter to crucible diameter. Average boule diameter is the average diameter of the boule along its nominal length, nominal length representing that portion of the boule that is utilized for formation of wafers according to downstream processing steps, generally not including the neck and tail (conical-shaped end caps at opposite ends of the boule). Typically, boule diameter is relatively constant along the nominal length of the boule. Formation at the minimum process aspect ratio helps ensure against unwanted or undesirable crystallographic orientation or re-orientation of the boule, also known as 'flipping'. More specifically, it is desired that the boule have the <111> orientation (triangular morphology), rather than the <110> orientation (square or hexagonal morphology), and sufficiently high aspect ratios may ensure against flipping from the <111> crystallographic orientation to the <110> crystallographic orientation.

With respect to the MgO—Al$_2$O$_3$ system, multiple samples were created based upon a 3:1 (2.9:1) b:a ratio, and a summary of the relevant process conditions is provided below in the table. Certain embodiments of the present invention have somewhat higher minimum process aspect ratios, such as not less than about 0.40, not less than about 0.42, or even not less than about 0.43. Other embodiments have even higher process aspect ratios such as not less than about 0.44, or even greater.

TABLE

| Pull rate (mm/hr) | Crucible ID (inches) | Crucible lid ID (inches) | Crystal dia. (inches) | Result, <111> | Aspect Ratio |
|---|---|---|---|---|---|
| 1 | 4 | 2.5 | 2.2 | yes | 0.55 |
| 1 | 5 | 3.5 | 2.2 | no | 0.44 |
| 1 | 6 | 4.5 | 2.2 | no | 0.37 |
| 1 | 7 | 5.25 | 2.2 | no | 0.31 |
| 1 | 7 | 5.25 | 4.1 | yes | 0.59 |
| 1 | 6 | 4.5 | 3.1 | yes | 0.52 |
| 2.5 | 5 | 3.5 | 2.2 | yes | 0.44 |
| 2.5 | 6 | 4.5 | 2.2 | no | 0.37 |
| 2.5 | 7 | 4 | 3.1 | yes | 0.44 |
| 2.5 | 6 | 2.75 | 2.2 | partly | 0.37 |

Typically, the boule and wafers therefrom consist essentially of a single spinel phase, with no secondary phases. According to another feature, the boule and the wafers processed therefrom are free of impurities and dopants. According to one embodiment, the wafers processed into device substrates for optoelectronic applications, the wafer and device substrates having a composition consisting essentially of aMgO.bAl$_2$O$_3$, wherein a ratio of b:a is greater than 1:1. In this regard, impurities and dopants are generally precluded. For example, Co is restricted from inclusion in the foregoing embodiment, which otherwise is a dopant for Q-switch applications. In contrast to Q-switch applications, it is generally desired that a relatively pure spinel is utilized substantially free of dopants that affect the basic and novel properties of the device substrate.

According to embodiments of the present invention, a single crystal spinel boule is formed having desirable properties. In addition to the desired <111> orientation described above, the boules, wafers, and device substrates formed therefrom also generally have reduced mechanical stress and/or strain, as compared to a stoichiometric articles having a b:a ratio of 1:1. In this regard, embodiments of the present invention provide desirably high yield rates in connection with formation of single crystal wafers that form substrates of active devices, and also provide improved processing features, discussed in more detail hereinbelow.

With respect to improved processing features, the boule may be cooled at relatively high cooling rates such as not less than about 50° C./hour. Even higher cooling rates may be utilized according to embodiments of the present invention, such as not less than about 100° C./hour, 200° C./hour and even at a rate of greater than about 300° C./hour. The increased cooling rates desirably improve throughput of the fabrication process for forming single crystal boules and further reduce the thermal budget of the entire fabrication, and accordingly reduce costs. Boules formed according to conventional processing generally are cooled at relatively low cooling rates, in an attempt to prevent fracture during the cooling process. However, according to embodiments of the present invention, the cooling rates may be substantially higher yet still provide intact boules in the as-cooled form.

Generally, conventional cooling rates are on the order of 40° C./hour or less, requiring cooling periods on the order of days.

Still further, according to another embodiment of the present invention, annealing of the boule, conventionally carried out subsequent to cooling, is restricted to a relatively short time period. Typically, the time period is not greater than about 50 hours, such as not greater than about 30 hours, or even 20 hours. According to certain embodiments, the annealing is restricted to a time period not greater than about 10 hours. Indeed, annealing may be substantially completely eliminated, thereby obviating post-forming heat treatment. In contrast, conventional boule forming technology generally requires use of substantial anneal periods in an attempt to mitigate residual internal stress and strain, responsible for low wafer yield rates as well as boule fracture. Without wishing to be tied to any particular theory, it is believed that the reduction and internal stress and strain in the boule according to embodiments herein permits such flexible processing conditions, including decreased or complete elimination of annealing periods, as well as increased cooling rates as noted above.

According to another feature, the reduction in internal mechanical stress and strain are quantified by yield rate, the number of intact wafers formed by slicing the boule. Typically, slicing is carried out by any one of several slicing techniques, most notably wire sawing. As used herein, yield rate may be quantified by the formula $w_i/(w_i+w_f) \times 100\%$, wherein $w_i$=the number of intact wafers processed from the boule, and $w_f$=the number of fractured wafers from the boule due to internal mechanical stress or strain in the boule. Conventionally, this yield rate is very low, such as on the order 10%. The unacceptably low yield rate is a manifestation of excessive internal stresses and strain in the boule. In contrast, yield rates according to embodiments of the present invention are typically not less than about 25%, 30% or even 40%. Other embodiments show increasingly high yield rates, such as not less than about 50, 60 or even 70%. Indeed, certain embodiments have demonstrated near 100% yield. This reduce internal mechanical stress and/or strain as quantified above is not only present within the as-formed (raw) boules, but also the processed boules, the wafers sliced from boules, and the device substrates cleaved from the wafers. In this regard, the foregoing description of processed boules generally denotes boules that have been subjected to post-cooling machining steps, such as grinding, lapping, polishing and cleaning.

The wafers sliced from the boule have a generally sufficient diameter and associated surface area to provide reduced processing costs for the active device manufacturer, in a manner similar that increased wafer size reduces semiconductor die cost in the semiconductor fabrication field. Accordingly, it is generally desired that the wafers have a nominal diameter of not less than about 1.75 inches, generally not less than about 2.0 inches and in certain embodiments, 2.5 inches or greater. Current state-of-the art processing tools for handling wafers in active device fabrication are geared to handle two inch wafers, and processing equipment for handling three inch wafers are presently coming on-line. In this regard, due to processing features and wafer features described herein, next-generation wafers may be supported according to embodiments of the present invention.

Figure 1B:
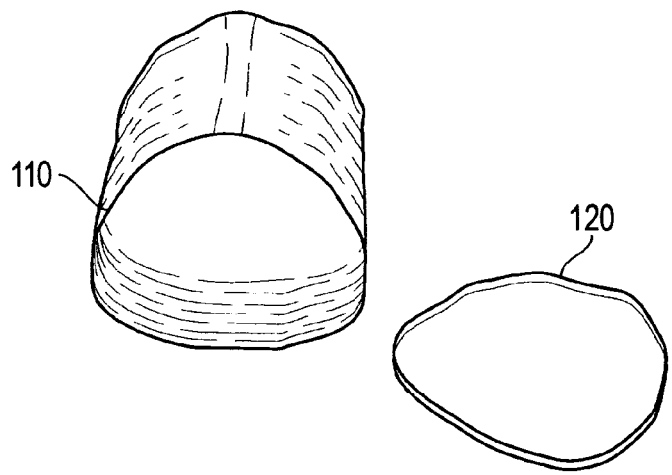
Figure 1C:
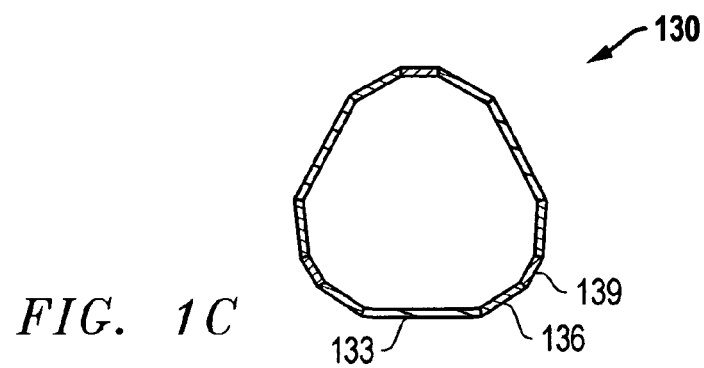

An as-grown <111> single crystal spinel boule and its facet structure is illustrated in FIG. 1. Specifically, FIG. 1(a) is a photograph of a Czochralski grown boule 100, while FIG. 1(b) is a photograph of a Czochralski grown boule with the neck and tail removed 110. FIG. 1(b) also includes a wafer 120 that has been sliced from the boule, clearly showing facets on the outer surface. FIG. 1(c) is a schematic cross-section 130 of the <111> grown boule illustrating the facets 133, 136, 139.

As shown in FIG. 1(c), a <111> single crystal spinel boule is generally triangular shaped with twelve facets 133, 136, 139. The boule includes three large facets 133 which are {22-4} plane family. The six intermediate size facets 136 extend along the {02-2} plane family while the three small facets 139 extend along {-2-24} plane family.

In one embodiment, a flat (generally planar surface) is formed, typically by a machining operation) along one of the {22-4} facets 133. In the spinel structure of the boule, a plane of the {22-4} plane family is parallel to the locus of points (forming a line) that a plane of the {001} cleavage plane family makes with the front face or surface of the wafer. Thus, the flat is substantially (within approximately 5 degrees) parallel to the lines that the {001} cleavage plane family makes with the surface of the wafer. Therefore, a flat in a plane of the {22-4} plane family identifies an orientation of a cleavage plane of the wafer.

Figure 2:
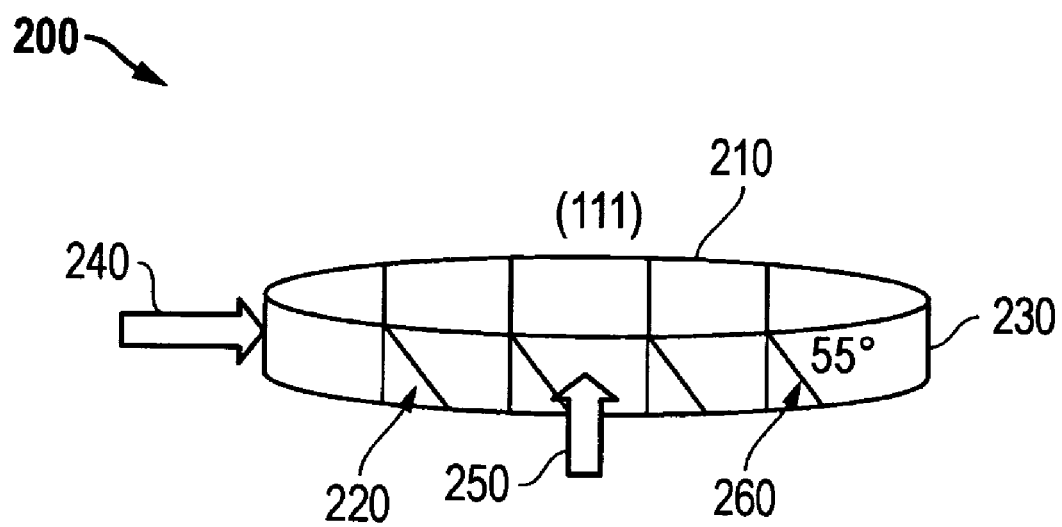
FIG. 2 is a perspective view of a wafer according to an embodiment of the invention.

A relationship between the {22-4} plane family and the {001} cleavage plane family in single crystal spinel wafer is illustrated in FIG. 2. A <111> oriented substrate wafer 200 has a front face 210, a back face 220 and an outer peripheral edge 230 between the faces 210, 220. In one embodiment, a major flat 240 is ground into the edge 230 along a plane of the {22-4} plane family. The major flat 240 is generally ground into the boule before the wafer 200 is sliced from the boule, but may be done after slicing if desired.

As shown in FIG. 2, the locus of points formed by the intersection of the cleavage plane 260 and the front face 210 forms a line that is parallel to the flat 240. While in the embodiment shown, the projected lines along the front face and the major flat are parallel to each other, a different orientation may be used, such as a predetermined non-zero angle between the major flat and the projected lines. Cleavage initiated in the wafer 200 along a {001} cleavage plane 260 will intersect the front face 210 of the wafer 200 parallel to the major flat 240. This is particularly advantageous because the (10-10) cleavage plane of an epitaxial layer of (0001) $Al_xGA_{1-x-y}In_yN$ grown on a <111> spinel wafer 200 is aligned with a {001} cleavage plane 260 in the wafer 200. That is, an edge of the (10-10) cleavage plane in the $Al_xGa_{1-x-y}In_yN$ epitaxial layer is substantially parallel to locus of points formed at the wafer cleavage plane-front face intersection.

Figure 3:
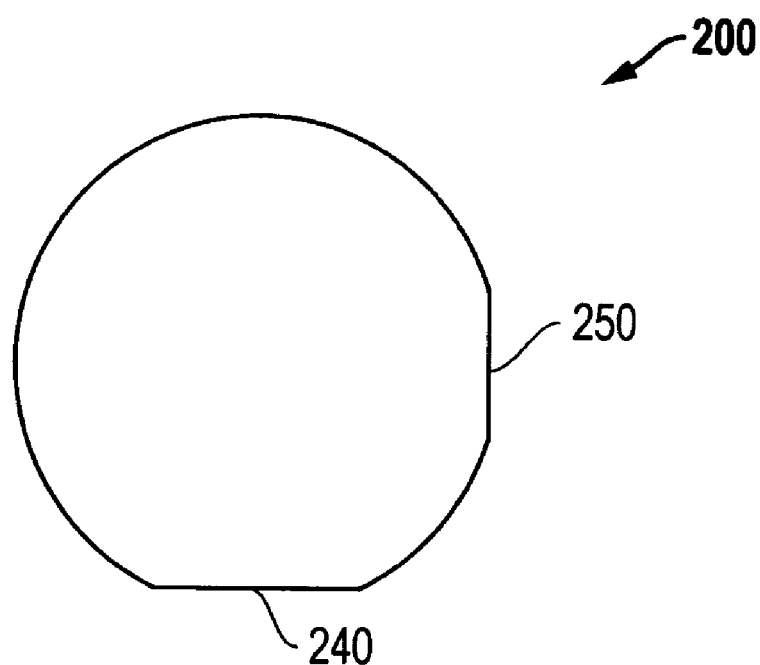
FIG. 3 is a top view of a wafer according to an embodiment of the invention.

As shown in FIGS. 2 and 3, a second, minor flat 250 is ground into the outer peripheral edge 230, generally extending along a plane non-parallel to the plane of the first flat, such as along a plane in the {02-2} and {01-1} plane families, and also including a plane of the {22-4} and {11-2}families that is non parallel to the plane of the major flat. Preferably the minor flat 250 is ground into the boule before the wafer 200 is sliced from the boule. However, the minor flat 250 may be ground into the wafer 200 after being sliced, if desired.

As also shown in FIG. 2, the wafer is oriented such that the cleavage planes slope away from the major flat. Stated more precisely, each cleavage plane intersects the back face along a locus of points forming a line, the line along the back face being spaced from the major flat a greater distance than the spacing between the line along the front face and the major flat. This orientation, the downward slope relative to the major flat from the front face, is considered herein a 'negative' slope. Each plane makes an angle with the front face within a range of about 40 to 60 degrees, typically about 55 degrees as measured, as shown in FIG. 2.

In the spinel structure, a normal (perpendicular line) to the major flat and a normal to the second flat lie in the same plane such that the normals intersect each other, and the normals make an angle of, for example, 60, 90, 120, or 150 degrees with each other. For example normal to the minor flat extending along a (02-2)/(01-1) plane makes a 30, 90 and 150 degree angle to a normal of the major flat extending along a plane of the {22-4}/{1'-2} plane families. A normal to the minor flat extending along a (22-4)/(11-2) plane may make a 60 degree angle, for example, to a normal of the major flat extending along a plane of the {11-2}/{22-4} plane families. By use of the major and minor flats oriented as described herein, the wafer 200, the wafer 200 may be oriented precisely.

Figure 4A:
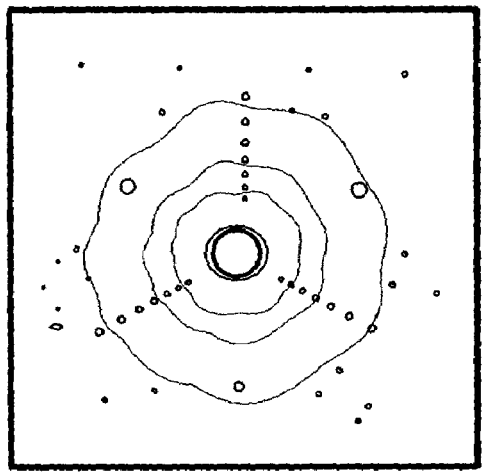
FIGS. 4a and 4b are backscattered images of a spinel <111> in opposite orientations, FIG. 4c a <011> oriented boule, and FIG. 4d a <100> orientated boule.
Figure 4B:
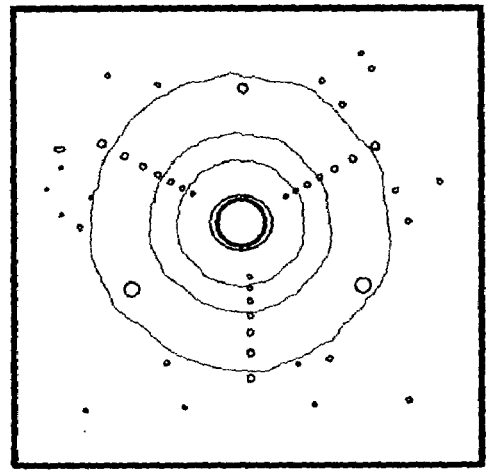
Figure 4C:
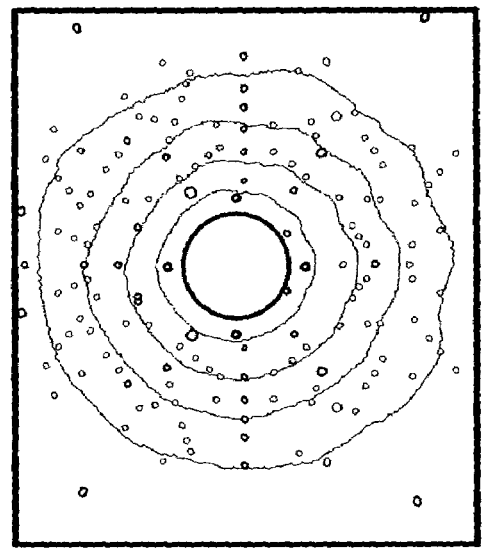
Figure 4D:
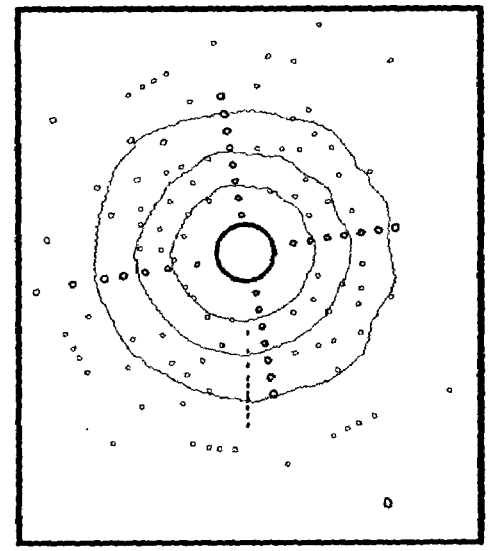
Figure 5A:
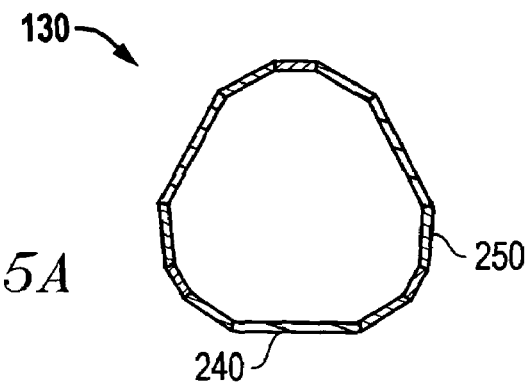
FIGS. 5a-5c illustrate orientation of a spinel boule according to an embodiment of the invention, FIG. 5a illustrating a cross-section of a <111> spinel boule showing the major and minor flat, FIG. 5b a backscattered image of a <111> orientation, and FIG. 5c a boule with the front side identified.
Figure 5B:
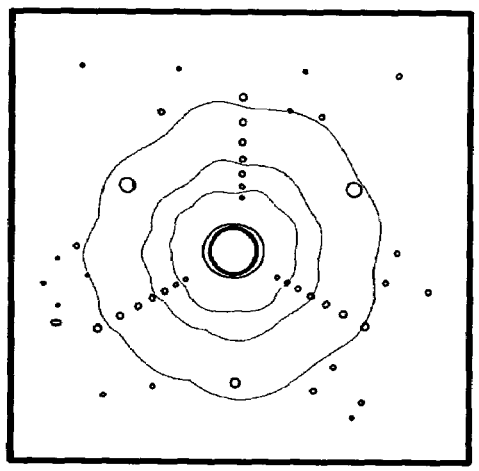
Figure 5C:
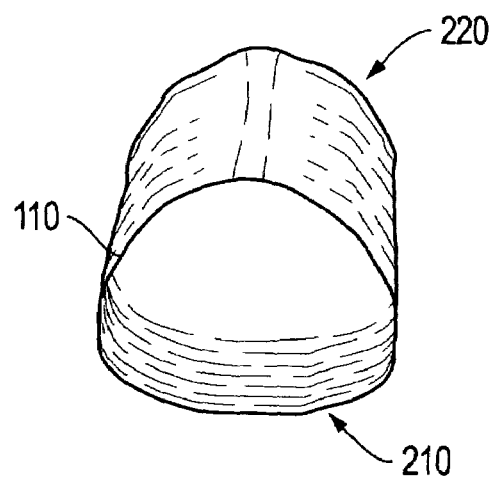

Orientation of the boule 110 is accomplished with the aid of electron imaging, such as through backscattered electron imaging with Laue camera. This method can be explained with the assistance of FIGS. 4(a)-4(d) and 5(a)-5(c). FIGS. 4(a) to 4(d) are back-scattered photos of various orientations of single crystal spinel. FIGS. 4(a) and 5(b) illustrate the pattern of a <111> oriented spinel single crystal formed when the triangular cross-section 130 has an apex is pointing up, the major flat 240 is the base of the triangle opposite the apex, and the face opposite the camera is the front face 210.

In carrying out imaging, first the neck and the tail are removed from the as-grown boule 100, leaving behind first and second flat surfaces at opposite ends of the cylindrical boule oriented such that the central axis of the boule is perpendicular to the flat end surfaces, and the central axis is generally parallel to a <111> direction. By generally parallel, typically the axis is within 5 degrees, generally within 3 degrees, and desirably within 2 degrees of a <111> direction. Certain embodiments are within 1 degree (zero representing strictly parallel). Then the boule 110 is imaged in back-scattered mode. FIG. 4(b) represents the back face as the face opposite the camera. Once the front face 210 and the back face 220 are identified, the major flat 240 and the minor flat 250 are ground into the boule 110. According to one embodiment, the wafers 200 cut from the boule 110 and oriented with the front face facing up, have the minor flat 250 being spaced from the major flat 240 such that the normals make and angle less than approximately 180 degrees counter clockwise. According to this configuration, the wafer may be properly oriented during manufacture for processing operations, such as proper orientation for finishing operations that typically are carried out on the substrate surface intended for epilayer deposition. In addition, the manufacturer of electronic or optoelectronic devices may properly identify the surface for epilayer grown, and orient the wafer for epitaxial growth.

According to an embodiment, optoelectronic devices are formed utilizing wafers in accordance with the teachings herein. According to the process, $Al_xGa_{1-x-y}In_yN$ epilayer is generally grown on the wafer. The values of x and y can both vary from 0 to 1. Preferably, $0 \leq x \leq 0.25$ and $0 \leq y \leq 0.5$. An edge of a cleavage plane of the $Al_xGa_{1-x-y}In_yN$ epilayer is generally parallel to the projection of a (001) cleavage plane in the front face of the wafer. Additional layers of varying concentration may then be grown as necessary, depending on the particular device to be fabricated. Further, several additional steps such as patterning and contact forming may also be conducted in order to fabricate LEDs and lasers. The details of actual device fabrication are known to one of ordinary skill in the fabrication art and are beyond the scope of this disclosure.

EXAMPLE

A boule (ingot) grown by the Czochralski technique had the top and tail removed to produce two flat surfaces. The boule ends (the two flat surfaces) were x-rayed using a Laue backscattered technique to verify orientation and to identify 1) the front-side for future wafers to ensure the (100) cleavage plane will cleave from the bottom face of the future wafers to the top face with the intersection line on the bottom being further from the to-be formed major flat than the intersection line on the top and 2) the approximate position of the major (1-1-2) (or (2-2-4)) and minor (01-1) (or (02-2)) flats. The boule ends were then x-rayed to measure the orientation and to align the axis of the boule to the <111> direction.

The boule was then turned to a diameter of approximately 2" to form a cylinder exactly parallel to the 111 direction (that is, the central axis was parallel to the <111> orientation). At this point the major and minor flat directions were marked on the top face by scribing. The major and minor flats were then added to the cylinder by grinding into the outer periphery of the boule to remove material along a direction that is perpendicular to the <111> direction, the flats formed thereby extending parallel to a <111> direction. The turned boule was then sliced into individual wafer blanks. The individual blanks were then lapped, given a bevel with grinding, had serial numbers written into them using a laser, and finally were polished along the front face, to provide a suitable surface for epitaxial layer growth.

The foregoing description has been presented for purposes of illustration and description. It is not intended to be exhaustive or to limit the scope to the precise form or embodiments disclosed, and modifications and variations are possible in light of the above teachings, or may be acquired from practice of embodiments of the invention.

What is claimed is:

1. A single crystal spinal wafer, comprising:
   a front face and a back face; and
   an outer periphery having first and second flats, wherein the first flat indicates an orientation of the cleavage plane of the wafer, a cleavage plane of the wafer intersects the front face at a locus of points extending along a line, the line being parallel to the first flat, and the second flat indicates a direction of cleavage propagation of the cleavage plane.

2. The single crystal spinel wafer of claim 1, wherein the wafer has a <111> crystallographic orientation.

3. The single crystal spinel wafer of claim 1, wherein the front and back faces of the wafer extend along a {111} crystal plane.

4. The single crystal spinel wafer of claim 1, wherein the first flat extends along a plane in the {22-4} and {11-2} plane families.

5. The single crystal spinel wafer of claim 1, wherein the second flat identifies the front and back surfaces of the wafer.

6. The single crystal spinel wafer of claim 1, wherein the cleavage plane makes an angle of about 55 degrees with respect to the front face.

7. The single crystal spinel wafer of claim 1,
   wherein the second flat extends along a plane in the {02-2}, {01-1}, {22-4} and {11-2} plane families, which is non-parallel to the plane of the first flat.

8. The single crystal spinel wafer of claim 1, wherein a normal to the first flat and a normal to the second flat lie in the same plane such that the normals intersect each other, and the normals make an angle of 60, 90, 120, or 150 degrees.

9. The single crystal spinel wafer of claim 1, wherein the wafer comprises non-stoichiometric spinel.

10. The single crystal spinel wafer of claim 9, wherein the wafer has a composition is represented by the general formula $aAD.bE_2D_3$, wherein A is selected from the group consisting of Mg, Ca, Zn, Mn, Ba, Sr, Cd, Fe, and combinations thereof, E is selected from the group consisting Al, In, Cr, Sc, Lu, Fe, and combinations thereof, and D is selected from the group consisting O, S, Se, and combinations thereof, wherein a ratio b:a>1:1 such that the spinel is rich in $E_2D_3$.

11. The single crystal spinel wafer of claim 10, wherein A is Mg, D is O, and E is Al, such tat the single crystal spinel has the formula $aMgO.bAl_2O_3$.

12. The single crystal spinel wafer of claim 10, wherein the ratio b:a is not less than about 1.2:1.

13. The single crystal spinel wafer of claim 10, wherein the ratio b:a is not less than about 1.5:1.

14. The single crystal spinel wafer of claim 10, wherein the ratio b:a is not less than about 2.0:1.

15. The single crystal spinel wafer of claim 10, wherein the ratio b:a is not less than about 2.5:1.

16. The single crystal spinel wafer of claim 10, wherein the ratio b:a is not greater than about 4:1.

17. The single crystal spinel wafer of claim 10, wherein the wafer has a lower mechanical stress and strain compared to stoichiometrie spinel.

18. The single crystal spinel wafer of claim 1, further comprising an active layer, the active layer comprising a nitride semiconductor layer.

19. The singe crystal spinel wafer of claim 18, wherein the nitride semiconductor layer comprises $Al_xGa_{1-x-y}In_yN$, where $0 \leq x \leq 0.25$ and $0 \leq y \leq 0.5$.

20. The single crystal spinel wafer of claim 1, wherein first flat is a major flat, and the second flat is a minor flat.

21. An active device provided on the wafer of claim 1.

22. The device of claim 21, wherein the device is an optoelectronic device selected from the group consisting of a laser and LED.

23. The wafer of claim 1, wherein the cleavage plane intersects the bottom face along a locus of points forming a second line, wherein the cleavage plane is oriented such that the cleavage plane slopes away from the first flat and that the second line is located a distance from the first flat that is greater than a distance between the first line and the first flat.

24. The wafer of claim 23, wherein the first flat is a major flat, the second flat is a minor flat.

25. The wafer of claim 23, wherein the second flat is positioned to indicate the direction of a slope of the cleavage plane.

26. A single crystal spinel wafer, comprising:

a front face and a back face; and an outer periphery having first and second flats, wherein the first flat indicates an orientation of a cleavage plane of the wafer and extends along a plane in the {22-4} and {11-2} plane families, the cleavage plane of the wafer intersects the front face at a locus of points extending along a line, the line being parallel to the first flat, and the second flat indicates a direction of cleavage propagation of the cleavage plane and extends along a plane in the {02-2}, {01-1}, {22-4} and {11-2} plane families.

* * * * *